United States Patent
Koren et al.

(10) Patent No.: US 8,362,837 B2
(45) Date of Patent: Jan. 29, 2013

(54) SYSTEM AND A METHOD FOR AMPLIFYING A SIGNAL BY MULTIPLE NON-LINEAR POWER AMPLIFIERS

(75) Inventors: Doron Shahar Koren, Rishon Lezion (IL); Sergey Toujikov, Rishon Lezion (IL)

(73) Assignee: Vyycore Ltd., Tel Aviv (IL)

( * ) Notice: Subject to any disclaimer, the term of this patent is extended or adjusted under 35 U.S.C. 154(b) by 0 days.

(21) Appl. No.: 13/113,099

(22) Filed: May 23, 2011

(65) Prior Publication Data
US 2012/0299644 A1    Nov. 29, 2012

(51) Int. Cl.
*H03F 3/68* (2006.01)
(52) U.S. Cl. .............. 330/295; 330/124 R; 330/136; 330/149
(58) Field of Classification Search .............. 330/51, 330/124 R, 295, 149, 136
See application file for complete search history.

(56) References Cited

U.S. PATENT DOCUMENTS 6,288,606 B1 * 9/2001 Ekman et al. ............... 330/51
7,119,621 B2 * 10/2006 Chen et al. ............... 330/295

* cited by examiner

*Primary Examiner* — Hieu Nguyen
(74) *Attorney, Agent, or Firm* — Oren Reches

(57) ABSTRACT

A system and a method are provided. The system may include (A) a measurement circuit arranged to measure at least a current power level of the input signal; (B) multiple non-linear power amplifiers; wherein different non-linear power amplifiers are associated with different power ranges; (C) a control circuit arranged to: (a) select at least one selected non-linear power amplifier to be used to amplify a second signal based on at least: (i) the current power level of an input signal; (ii) an association between the different power ranges and the different non-linear power amplifiers; (iii) an identity of at least one previously selected non-linear power amplifier; and (b) assist in an activation of the at least one selected non-linear power amplifier; and (D) a signal processing module, configured to process the input signal to provide the second signal such as to at least partially compensate for a non-linearity of each of the at least one selected non-linear power amplifier.

26 Claims, 7 Drawing Sheets

SYSTEM AND A METHOD FOR AMPLIFYING A SIGNAL BY MULTIPLE NON-LINEAR POWER AMPLIFIERS

BACKGROUND OF THE INVENTION

Non-linear power amplifiers which amplify electric signals may be characterized by non-linearity of the amplification, usually (though not necessarily) when the signal inputted to the amplifier comes closer to a saturation threshold of the amplifier.

Various input signals may exhibit high peak to average ratios and the amplification of such signals may result in additional signal distortions.

SUMMARY OF THE INVENTION

A system may provided and may include: (A) a measurement circuit arranged to measure at least a current power level of the input signal; (B) multiple non-linear power amplifiers; wherein different non-linear power amplifiers are associated with different power ranges; (C) a control circuit arranged to: (a) select at least one selected non-linear power amplifier to be used to amplify a second signal based on at least: (i) the current power level of an input signal; (ii) an association between the different power ranges and the different non-linear power amplifiers; (iii) an identity of at least one previously selected non-linear power amplifier; and (b) assist in an activation of the at least one selected non-linear power amplifier; and (D) a signal processing module, configured to process the input signal to provide the second signal such as to at least partially compensate for a non-linearity of each of the at least one selected non-linear power amplifier.

The control circuit may be arranged to determine a desired gain attribute of each of the at least one selected non-linear power amplifier to be used to amplify the second signal, and to assist in setting the gain attribute of each of the at least one selected non-linear power amplifiers to the desired gain attribute.

Adjacent power ranges may partially overlap, or may be non-overlapping.

The control circuit may be arranged to activate a first non-linear power amplifier associated with a first power range before deactivating a second non-linear power amplifier associated with a second power range that partially overlaps the first power range.

The control circuit may be arranged to select the at least one selected non-linear power amplifier in response to a magnitude of the input signal at a first moment, a magnitude of the input signal at a second moment, and to phases of the input signal at the first and the second moments.

The signal processing module may be arranged to process the input signal in response to the magnitude of the input signal at the first moment, the magnitude of the input signal at the second moment, and to phases of the input signal at the first and the second moments.

The signal processing module may be arranged to process the input signal by applying at least one filtering parameter to provide the second signal; the at least one filtering parameter is retrieved from a lookup table using a first, a second, and a third lookup table indexes, the first index is responsive to a magnitude of the input signal at a first moment, the second index is responsive to a magnitude of the input signal at a second moment, and the third index is responsive to phases of the input signal at the first and the second moments; the system comprises a delay circuit for delaying the input signal before the input signal is provided to the signal processing module.

The control circuit may be arranged to access the lookup table when selecting the at least one selected non-linear power amplifier.

The system may include a delay circuit that may be arranged to delay the input signal such as to arrive to the signal processing module when the at least one filtering parameter reaches the signal processing module.

The system may include a table updating module, configured to update at least one filtering parameter of the lookup table by calculating a cross signals error, and utilizing an adaptive algorithm to calculate the at least one filtering parameter such as to eliminate the cross signals error.

The system may include a table updating module, configured to update at least one filtering parameter of the lookup table by using a post distorter Voltera polynomial.

The system may be arranged to sample the input signal more than once between the first and second moments.

The system may be arranged to sample the input signal to provide a number of samples between the first and second moment and the number changes between filtration of the input signal in different times.

According to an embodiment of the invention a method may be provided. The method may include: (A) receiving an input signal; measuring at least the current power level of the input signal; (B) selecting at least one selected non-linear power amplifier to be used to amplify a second signal based on at least: (i) a current power level of an input signal; (ii) an association between different power ranges and different non-linear power amplifiers; (iii) an identity of at least one previously selected non-linear power amplifiers; (C) activating the at least one selected non-linear power amplifier; (D) processing the input signal to provide the second signal such as to at least partially compensate for a non linearity of each of the at least one selected non-linear power amplifier; and (E) amplifying the second signal by the at least one selected non-linear power amplifiers.

The method may include: determining a desired gain attribute of each of the at least one selected non-linear power amplifier to be used to amplify the second signal, and setting the gain attribute of each of the at least one selected non-linear power amplifiers to the desired gain attribute.

The adjacent power ranges may partially overlap.

The method may include activating a first non-linear power amplifier associated with a first power range before deactivating a second non-linear power amplifier associated with a second power range that partially overlaps the first power range.

The method may include selecting the at least one selected non-linear power amplifier in response to a magnitude of the input signal at a first moment, a magnitude of the input signal at a second moment, and to phases of the input signal at the first and the second moments.

The method may include processing the input signal in response to the magnitude of the input signal at the first moment, the magnitude of the input signal at the second moment, and to phases of the input signal at the first and the second moments.

The method may include processing the input signal by applying at least one filtering parameter to provide the second signal; the at least one filtering parameter is retrieved from a lookup table using a first, a second, and a third lookup table indexes, the first index is responsive to a magnitude of the input signal at a first moment, the second index is responsive to a magnitude of the input signal at a second moment, and the third index is responsive to phases of the input signal at the first and the second moments; the method comprises delaying the input signal before the input signal is provided to the signal processing module.

The method may include accessing the lookup table when selecting the at least one selected non-linear power amplifier.

The method may include delaying the input signal such that the input signal arrives to the signal processing module when the at least one filtering parameter reaches the signal processing module.

The method, further may include updating at least one filtering parameter of the lookup table by calculating a cross signals error, and utilizing an adaptive algorithm to calculate the at least one filtering parameter such as to eliminate the cross signals error.

The method may include updating at least one filtering parameter of the lookup table by using a post distorter Voltera polynomial.

The method may include sampling the input signal more than once between the first and second moments.

The method may include sampling the input signal to provide a number of samples between the first and second moment and the number changes between filtration of the input signal in different times.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
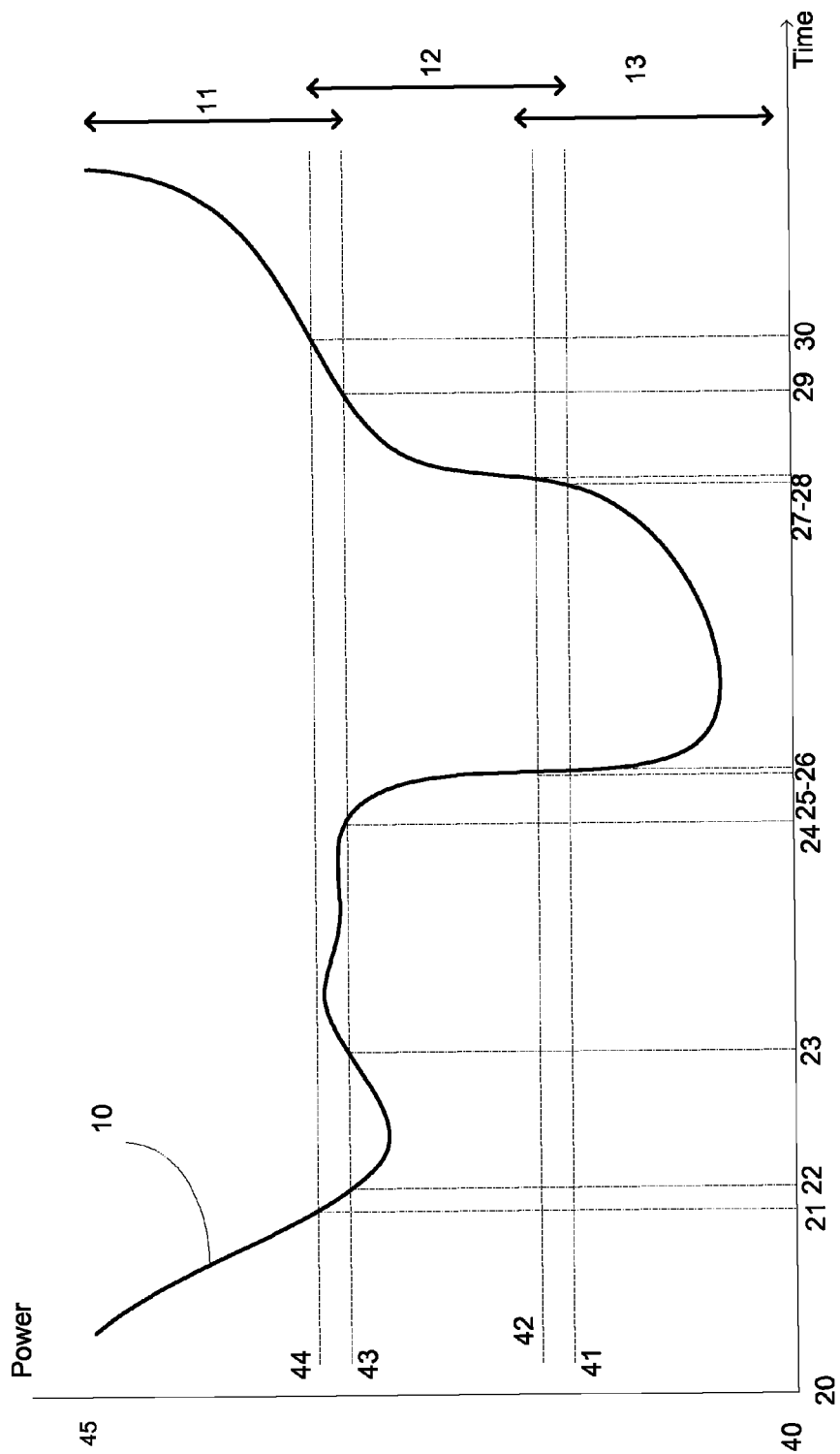
FIG. 1 illustrates an input signal and multiple power ranges according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

FIG. 1 illustrates an input signal 10 and three power ranges 11, 12 and 13 according to an embodiment of the invention. The three power ranges may partially overlap (as illustrated in FIG. 1) but this is not necessarily so. The overlap can simplify the control scheme—especially when applying a make before break handover during which a non-linear power amplifier is deactivated only after another non-linear power amplifier is activated.

FIG. 1 illustrates ascending power levels 40-45. The first power range 11 ranges between power levels 40 and 42. The second power range 12 ranges between power levels 41 and 44. The third power range 13 ranges between power levels 43 and 45.

In the example of FIG. 1 the number of power ranges is three, but is may be two or exceed three. FIG. 1 illustrates different power ranges of the same magnitude but this is not necessarily so and power ranges can differ from each other by magnitude.

The overlap regions between partially overlapping power ranges can be a small fraction of the power ranges but this is not necessarily so.

By partitioning the overall power range to multiple (K) power ranges and associating different non-linear power amplifiers per each power range, the peak to average ratio dealt by each of the non-linear power amplifiers is reduced by a factor of about K (depending upon the overlap) and thus negative aspects of large average to peak ratios are eliminated.

It is noted that the partition to power levels can be replaced by an equivalent partition to amplitude (magnitude).

The following table will illustrate the mapping between the level of the input signal and the activation of one or more selected non-linear amplifiers 380(1)-380(3) of a system.

| Period (Defined by two points in time) | Relevant power ranges (current power level of the input signal is included in the relevant power ranges) | Activated non-linear amplifier |
|---|---|---|
| 20-21 | 11 | 380 (1) |
| 21-22 | 11 and 12 (overlap) | 380 (1) and 380 (2) |
| 22-23 | 12 | 380 (2) |
| 23-24 | 11 and 12 (overlap) | 380 (1) and 380 (2) |
| 24-25 | 12 | 380 (2) |
| 25-26 | 12 and 13 (overlap) | 380 (2) and 380 (3) |
| 26-27 | 13 | 380 (3) |
| 27-28 | 12 and 13 (overlap) | 380 (2) and 380 (3) |
| 28-29 | 12 | 380 (2) |
| 29-30 | 11 and 12 (overlap) | 380 (1) and 380 (2) |
| 30-31 | 11 | 380 (1) |

Figure 2:
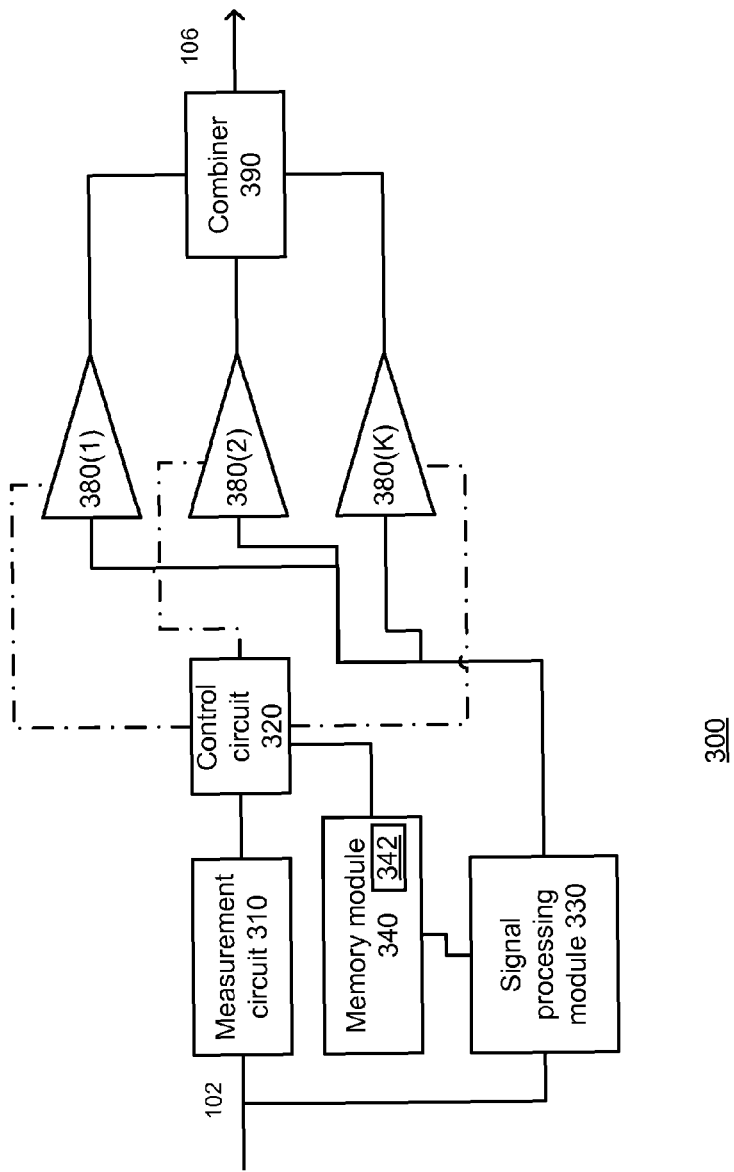
FIG. 2 illustrates a system, according to an embodiment of the invention.

FIG. 2 illustrates a system 300 according to an embodiment of the invention.

System 300 includes:
i. A measurement circuit 310 arranged to measure at least a current power level of an input signal.
ii. Multiple non-linear power amplifiers 380(1)-380(K); wherein different non-linear power amplifiers are associated with different power ranges.
iii. Control circuit 320 that is arranged to:
  (a) select at least one selected non-linear power amplifier to be used to amplify a second signal based on at least: (i) the current power level of an input signal; (ii) an association between the different power ranges and the different non-linear power amplifiers; (iii) an identity of at least one previously selected non-linear power amplifier; and (b) assist in an activation of the at least one selected non-linear power amplifier.

iv. Signal processing module 330, configured to process the input signal to provide the second signal such as to at least partially compensate for a non-linearity of each of the at least one selected non-linear power amplifier.

v. Power combiner 390 arranged to combine the amplified signals from each of the at least one selected non-linear power amplifiers to provide an output signal. The output signal may be transmitted by an antenna.

vi. A memory module 340.

The control circuit 320 may be arranged to determine a desired gain attribute of each of the at least one selected non-linear power amplifier to be used to amplify the second signal, and to assist in setting the gain attribute of each of the at least one selected non-linear power amplifiers to the desired gain attribute. This can be achieved by sending gain attribute commands to the non-linear power amplifiers and activation and deactivation commands to the non-linear power amplifiers, depending upon the selection.

The control circuit 320 may be arranged to activate a first non-linear power amplifier (for example—380(1)) associated with a first power range (for example—first power range 11) before deactivating a second non-linear power amplifier (for example—380(2)) associated with a second power range (for example—380(2)) that partially overlaps the first power range. This can occur when the power of the input signal changes from being within the second power range to being within the first power range.

The control circuit 320 may be arranged to select the at least one selected non-linear power amplifier in response to a magnitude of the input signal at a first moment, a magnitude of the input signal at a second moment, and to phases of the input signal at the first and the second moments. The selection may also be responsive to the magnitude and phase of the input signal at multiple moments that may precede the first moment and the second moment.

The signal processing module 330 may be arranged to process the input signal in response to the magnitude of the input signal at the first moment, the magnitude of the input signal at the second moment, and to phases of the input signal at the first and the second moments.

The signal processing module 330 may be arranged to process the input signal by applying at least one filtering parameter to provide the second signal. The at least one filtering parameter may be retrieved from a lookup table 342 stored in the memory module 340 using a first, a second, and a third lookup table indexes, the first index is responsive to a magnitude of the input signal at a first moment, the second index is responsive to a magnitude of the input signal at a second moment, and the third index is responsive to phases of the input signal at the first and the second moments; the system comprises a delay circuit for delaying the input signal before the input signal is provided to the signal processing module.

The memory module 340 can store control information such as selection information, gain information, pervious selection decisions, signal processing information such as filtering coefficients and the like.

The control circuit 330 may be arranged to access the lookup table 342 (or another lookup table) when selecting the at least one selected non-linear power amplifier. The control circuit 330 can access the lookup table 342 using any of the mentioned above indexes and, additionally or alternatively, using one or more additional lookup table indices such as the current power level of an input signal and an identity of at least one previously selected non-linear power amplifier.

Thus, when electing which non-linear power amplifier to select one or more previous selections can be taken into account. The number of previous selection and the weight to apply to each previous selection can be set in advance or be altered over time. A desired tradeoff can be set between too many activations and de-activations of non-linear power amplifiers and too few activations and deactivations of non-linear power amplifiers.

According to an embodiment of the invention a hysteresis can be applied when selecting which non-linear power amplifiers to select.

Figure 3:
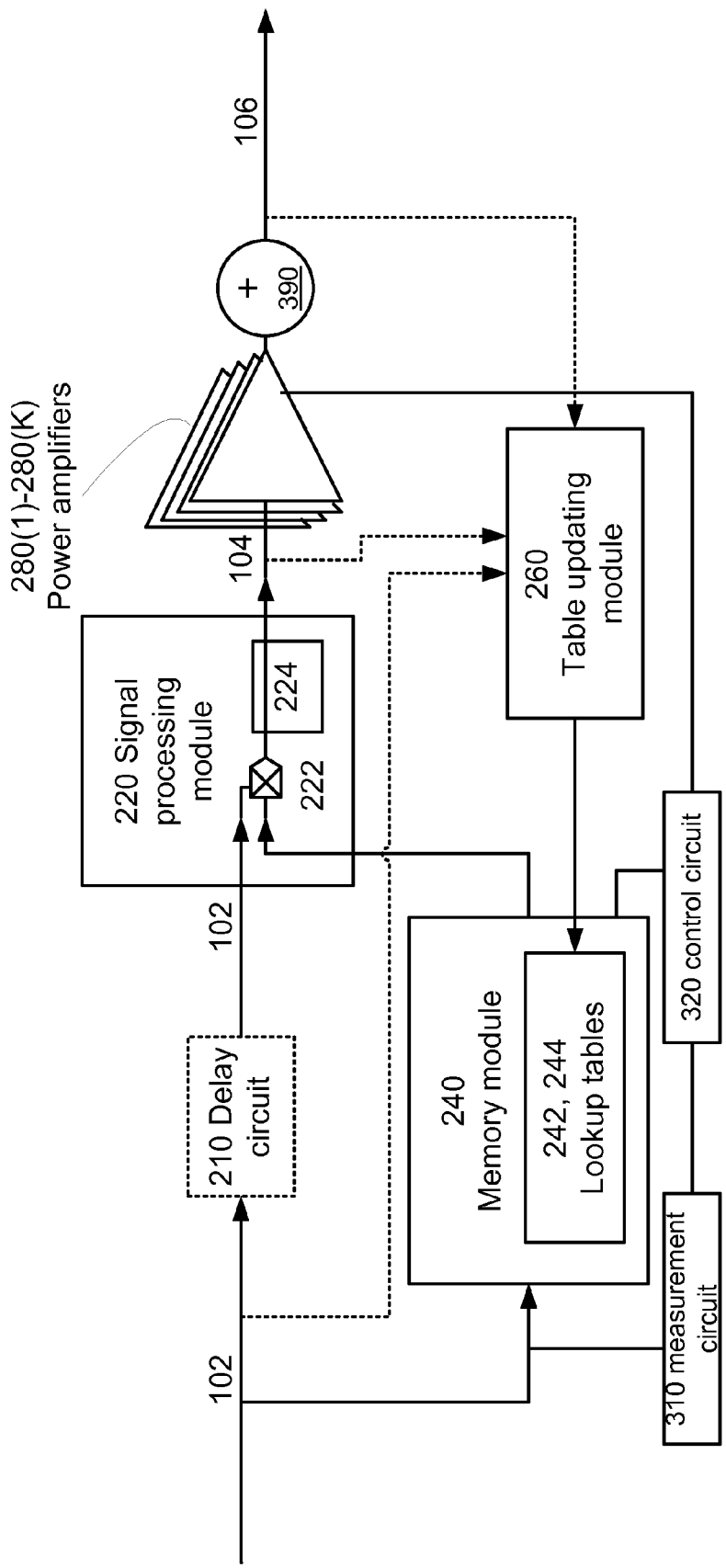
FIG. 3 illustrates a system according to an embodiment of the invention.

FIG. 3 illustrates system 200 for processing an input signal, according to an embodiment of the invention.

System 200 includes signal processing module 220 that receives an input signal 102, processes it (possibly only if required), and provides a second signal (denoted 104 in the diagram), to be amplified by one or more selected non-linear power amplifiers out of multiple non-linear power amplifiers 380(1)-380(K). It is noted that signal processing module 220 may include hardware, software, and/or firmware components, and any combination thereof. It is noted that conveniently, the processing of the signal may be carried out by hardware components of signal processing module 220, such as a hardware signal multiplier.

Signal processing module 220 is further configured to transmit the second signal to the non-linear power amplifier 380(1)-380(K) (which may be external to system 200, and may be a component of which), each of which is characterized by non-linearity and which is adapted to amplify the second signal 104. The one or more selected non-linear power amplifiers provide one or more amplified signals that are combined by combiner 390 to provide an output signal.

System 200 includes hardware memory module 240 which configured to store a lookup table 242 (also referred to as LUT 242). Lookup table 242 stores different filtering parameters that should be used for the processing of the input signal by signal processing module 220 in different situations.

Hardware memory module 240 also stores a second lookup table 244 that stores selection information relating to the selection of one or more non-linear power amplifiers and may also stores gain information about the gain of the one or more selected non-linear power amplifiers.

The first and second lookup tables 242 and 244 may form a combined lookup table such as lookup table 342 of FIG. 2.

Signal processing module 240 is configured to process input signal 102 in response to at least one filtering parameter to provide the second signal 104 so as to at least partly compensate for the non-linearity of each of the one or more selected non-linear power amplifiers.

The at least one filtering parameter is retrieved from the lookup table 242 using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments.

The retrieving may be carried out by signal processing module 220 or components thereof, by retrieving module of memory module 240 (not shown), or in any other way that is known in the art.

System 200 may or may not include non-linear power amplifiers 380(1)-380(K). The non-linearity of each of the non-linear power amplifiers may occur in one or more parts of its operational range, or in the entire operational range, without limiting the scope of the invention.

Signal processing module 220 may conveniently operate as a pre-distorter filter (or signal processor) for each of the non-linear power amplifiers, processing an input signal (denoted 102 in the diagram) before it is provided to one or more selected non-linear power amplifiers, so the output signal provided after amplification and summation is sufficiently linear in respect to the input signal. The degree of linearity between the input and output signals may differ in different implementations of the invention, and in different times, but it is generally substantially more linear than the linearity possible by the one or more selected power amplifiers.

The retrieving of the at least one filtering parameter from lookup table 242 is conveniently relatively fast and requires a relatively small amount of computational power. According to an embodiment of the invention, lookup table 242 is a three dimensional lookup table (and memory module 240 is configured to store a three dimensional lookup table), in which every group of at least one filtering parameter that is used for filtering is retrievable using three indexes, two of which are magnitude related, and one of which is phase related, as discussed above.

The at least one filtering parameter which is retrieved from lookup table 242 for filtering by signal processing module 220 may include, according to an embodiment of the invention, of a complex compensation coefficient, wherein signal processing module 220 is configured to multiply the input signal by the compensation coefficient for the generating of the second signal (e.g. by a multiplier 222). It is noted that multiplying the entire input signal by a single complex compensation coefficient (or multiplying components of the complex input signal by two real parameters, which correspond to a complex parameter) is conveniently a relatively fast and not complex way of filtering the input signal.

It is noted that the at least one filtering parameter may be provided to signal processor 220 as an electric signal which can be analogously used for processing the input signal using the electric signal and analogue signal processing technique. For example, electric parameters of the electric signal that is responsive to the at least one filtering parameter—e.g. amplitude, phase, magnitude—may indicate of a value of the at least one parameter. Such signal may be generated by memory module 240, or by an additional signal generating or processing module (not illustrated).

According to an embodiment of the invention, the input signal may be provided to signal processing module 220 after being delayed by a delay circuit 210 (which may include, for example, a flip-flop), e.g. so the input signal will timely reach processing when the at least one filtering parameter reaches signal processing module 220 or a sub-module of which.

As aforementioned, the first index is responsive to a magnitude of the input signal at a first moment ($M_{t1}$), and the second index is responsive to a magnitude of the input signal at a second moment ($M_{t2}$), wherein the magnitude may be calculated as known in the art (e.g. $M=\sqrt{I^2+Q^2}$)

It is noted that as the first signal may conveniently be a digital signal, the magnitude of the signal is sampled in discrete sampling times (usually in a constant sampling frequency, but not necessarily so). According to an embodiment of the invention, the first and the second moments are consecutive moments of a discrete sampling scheme. That is, the second magnitude value, taken at the second moment, may be in taken in a consecutive sample to the first moment in which the first magnitude value is taken. It is noted that the number of samples between the first and the second moment may differ than one, in different embodiments of the invention, and that it is may or may not change between the filtration of the signal in different times.

It is noted that while more than two magnitude samples may be determined and utilized for the retrieval of the filtering parameters from a lookup table (using additional indexes, on top of the first and the second indexes), the added value of such additional samples (e.g. $M_{t3}$, $M_{t4}$) is usually not as valuable for the retrieval of efficient filtering parameters. Therefore, the phase dependent third index is being utilized. Using magnitude of different times counts for memory of the channel, and may be used, for example, to overcome non-linearities which result from a memory of the physical channel (e.g. non-linear power amplifiers or other components, either of system 200 or external to it).

As aforementioned, the third index is responsive to phases of the input signal at the first and the second moments. According to an embodiment of the invention, the third index is responsive to a difference between the phases of the input signal at the first and the second moments (also denoted $\Delta\phi$).

It is noted that beside processing the input signal in response to the at least one filtering parameter retrieved from lookup table 242 (a processing which may conveniently be intended to overcome an expected non-linearity of the one or more selected power amplifiers, as well as of other components of the system that participates in transmitting and/or processing the signal as it is being transmitted), other types of processing may be applied to the signal before it is being transmitted to the one or more selected power amplifiers.

For example, the signal transmitted may be converted from a digital signal to an analogue signal, by upconverting the signal, low-pass filtering, and other filtering, processing and manipulating techniques that are known in the art. Such additional filtering may be carried out, according to an embodiment of the invention, by one or more filtering modules 224. It is noted that the filtering may compensate for non-linearity (or other imperfections) of such components as well, and not only of the one or more selected non-linear power amplifiers.

Figure 4:
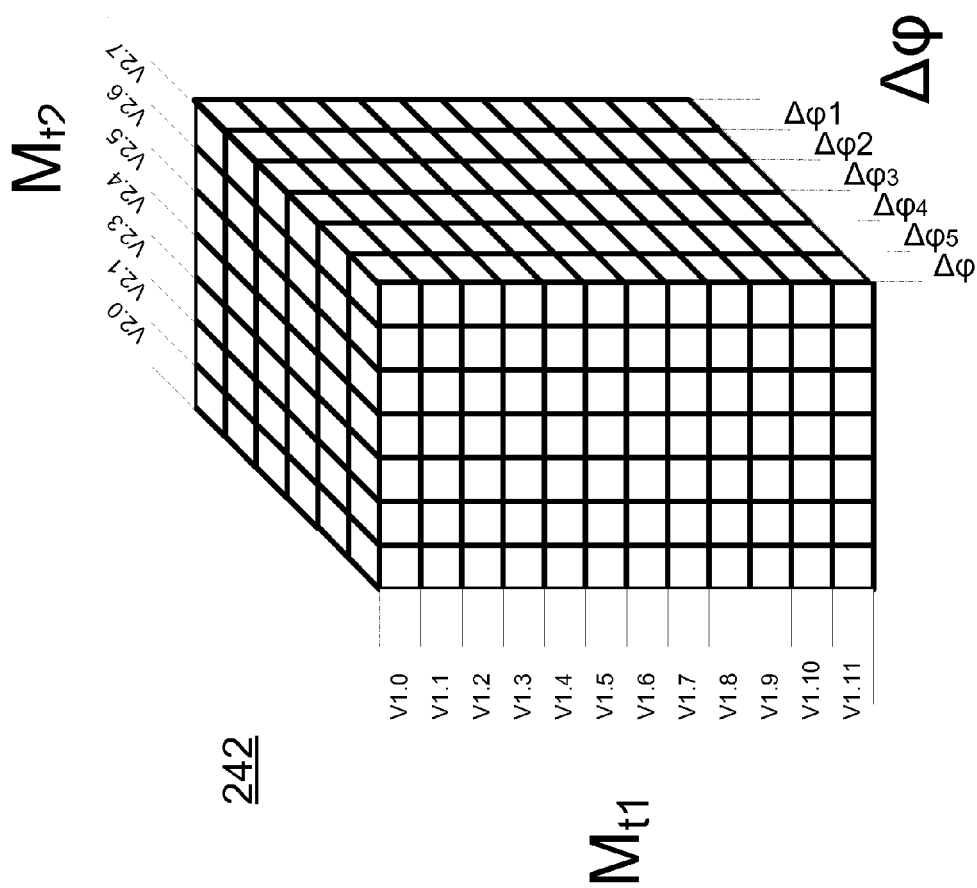
FIG. 4 illustrates a lookup table, according to an embodiment of the invention.

FIG. 4 illustrates lookup table 242, according to an embodiment of the invention. It is noted that the number of first indexes may differ from that of the second and/or third indices, and so on. According to an embodiment of the invention, the size of the lookup table is 8×16×32 (not as illustrated).

It is noted that the indexes may be organized in equal intervals (e.g. multiples $n \cdot M_0$ of a given magnitude value $M_0$ for a given set of consecutive integer n's), but this is not necessarily so.

Since only a finite (and possibly relatively small) number of indexes is used for each of the parameters, according to an embodiment of the invention signal processing module 220 is configured to process the input signal in response to at least one interpolated value that is determined in response to at least one filtering parameter and to at least one other filtering parameter, wherein the at least one other filtering parameter is retrieved from the lookup table using at least one lookup table index that is different from the first, the second, and the third lookup table indexes, and which is responsive to a parameter selected from a list consisting of the magnitude of the input signal at the first moment, the magnitude of the input signal at the second moment, and the phases of the input signal at the first and the second moments.

Referring again to FIG. 3 and to system 200, it is noted that signal processing module 220 may not always process the input signal in response to the at least one filtering parameter (or, it may process it in a trivial way such as multiplying it by a unit so as to keep it the same). Preventing of such processing in some of the cases (or enabling a simple trivial processing which does not substantially modify the input signal) may facilitate the amplification, reduce computational power, and may even reduce the number of interferences with the input signal, thus increasing a quality of the amplification.

For example, if the input signal is determined (by signal processing module 220 or a preceded module) to be of electrical parameters in which the amplification by the one or more selected non-linear power amplifiers will be substantially linear, processing may not be required.

According to an embodiment of the invention, signal processing module 220 (or another component of system 200) is further configured to determine in response to the input signal whether to process the input signal, signal processing module 220 is further configured to selectively process the input signal in response to a result of the determining.

The processing of the signal by signal processing module 220 is usually a continuous operation, in which in different times (and possibly at a rate that is equal to the sampling rate of the digital input signal) different filtering parameters are retrieved from lookup table 242, and used to process samples of the input signal at different times.

It is noted that the filtering parameters stored in lookup table 242 may be updated from time to time, either during operation (continuous filtering of an input signal)—possibly as result of the operation—or in an "off-line" manner.

According to an embodiment of the invention, system 200 includes table updating module 260 for updating one or more filtering parameters stored in lookup table 242. It is noted that according to an embodiment of the invention table updating module 260 may be a part of a filter updating module that control other parameters of signal processing module 220, e.g. a threshold for determining that processing of the input signal is required.

For example, according to several embodiments of the invention, the table updating module may update one or more filtering parameters stored in lookup table 242 (which may also be referred to as the table coefficients) by computing the filtering parameters using one of the following ways:

i. Using signal 102 and a feedback signal responsive to output signal 106, for calculating a cross signals error, and utilizing an adaptive algorithm to calculate the filtering parameters of lookup table 242 for eliminating the cross signals error.

ii. Using a post distorter Voltera polynomial to adaptively calculate the filtering parameters.

According to an embodiment of the invention, table updating module 260 is configured to update at least one filtering parameter of the lookup table in response to the amplified signal. According to such an embodiment of the invention, table updating module 260 may conveniently be configured to compare the amplified signal to the second signal (for compensating for non-linearities of the one or more selected non-linear power amplifiers) or to the input signal (for compensating for non-linearities of signal processing module 220 and the one or more selected non-linear power amplifiers). The updating by table updating module 260 conveniently includes updating a lookup table entry (one or more filtering parameters) that corresponds to the input signal amplified. It is noted that the comparison may pertain to a processed version of any of the above mentioned signal—e.g. a down-converted output signal, and so forth.

According to an embodiment of the invention, table updating module 260 is configured to update lookup table 242 in response to a physical condition of the one or more selected non-linear power amplifiers. For example, in different operating temperatures, different filtering parameters may be used. Such updating may include retrieving data from other parts of memory module 240 (which may or may not have slower access times).

It is noted that the filtering parameters of lookup table 242 may be determined so as to bring the operation of signal processing module 220 closer to that of a known filter (e.g. a known pre-distorter of the one or more selected non-linear power amplifiers that may utilize more complex processing scheme). According to an embodiment of the invention, table updating module 260 is configured to write to lookup table 242 at least one filtering parameter that is determined by minimizing a difference between a signal processed using lookup table 242 (conveniently by signal processing module 220, but not necessarily as this process may be carried out off line) and a signal processed using another filter.

It is noted that the different aforementioned functionalities discussed in relation to table updating module 260 may be implemented using one or more filter updating modules, which may be a part of system 200, or external to it.

Figure 5:
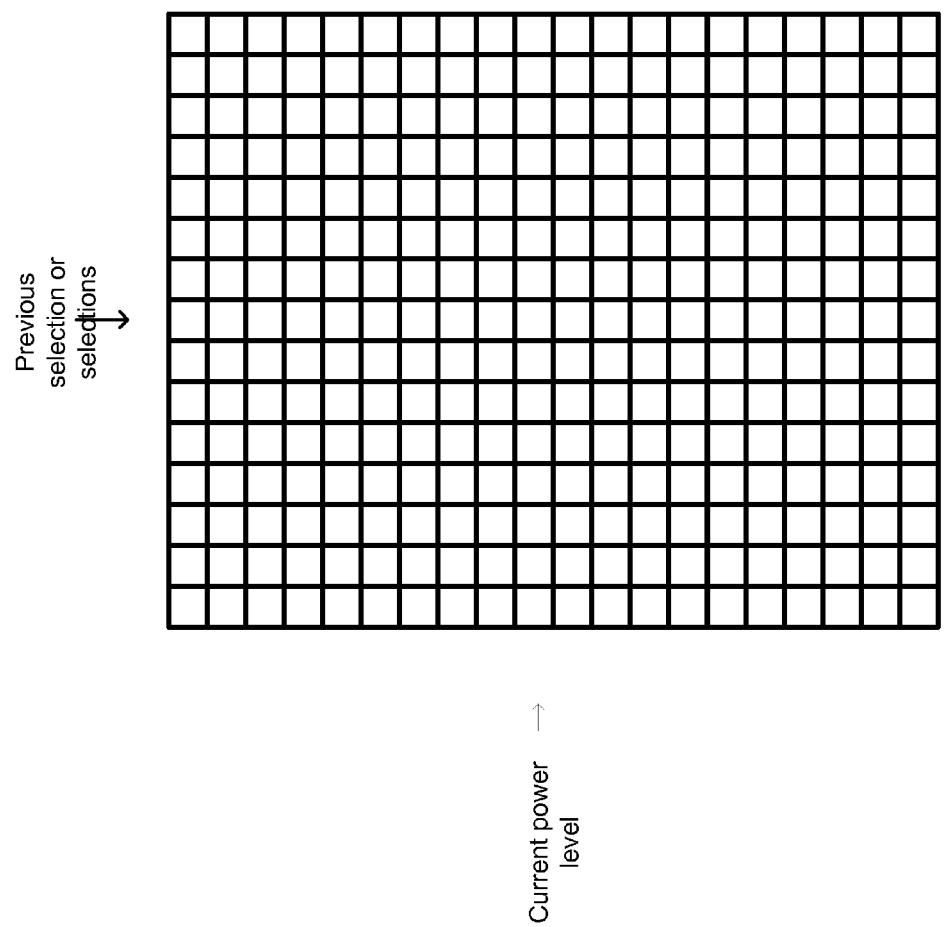
FIG. 5 illustrates a second lookup table, according to an embodiment of the invention.

FIG. 5 illustrates the second lookup table 244 according to an embodiment of the invention.

The second lookup table 244 stores selection information relating to the selection of one or more non-linear power amplifiers and may also stores gain information about the gain of the one or more selected non-linear power amplifiers.

It can be accessed by a first additional index and a second additional index. The first additional index is responsive to a current power level of an input signal and the second additional index is responsive to a last selection of one or more selected non-linear power amplifiers.

It is noted that the second lookup table 244 can be accessed by multiple indexes, each reflecting a different selection decision that were taken in the past.

The retrieved selection information can be used by the control circuit 320 to activate one or more selected non-linear power amplifiers and the retrieved gain information can be used to determine how to activate the one or more selected non-linear power amplifiers. For example—when it is determined to initiate a handoff process and activate two non-linear amplifiers instead of on—the gain of the previously activated non-linear amplifiers can be reduced—to compensate for the activation of the previously idle additional non-linear power amplifier.

It is noted that the first lookup table 242 and the second lookup table 244 can be combined and may be accessed by at least the first till third lookup indexes and at least two additional indexes.

A handoff can occur during multiple iterations during which the gain of one non-linear power amplifier is reduces while the gain of another non-linear power amplifier is increased.

Figure 6:
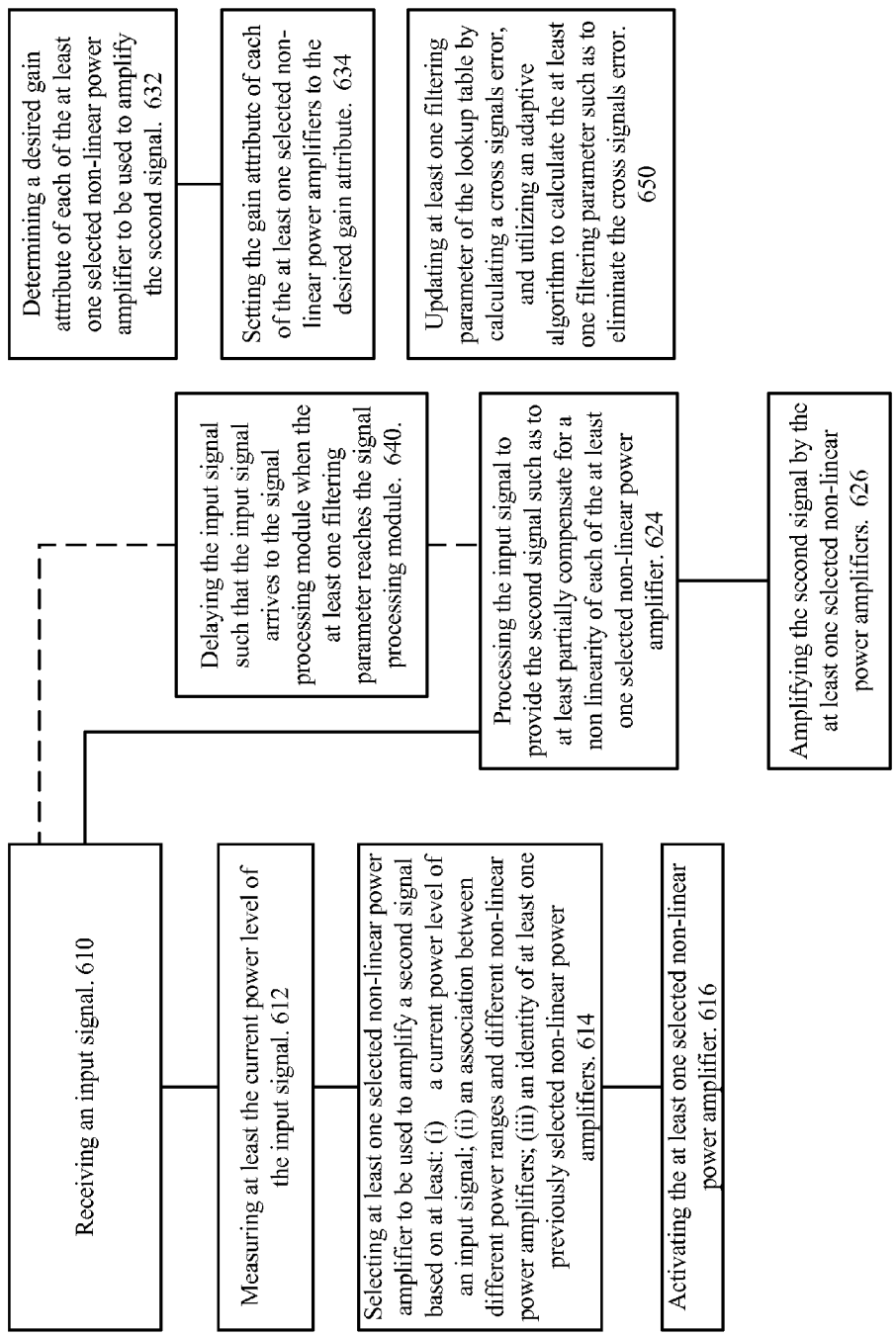
FIG. 6 illustrates a method, according to an embodiment of the invention.

FIG. 6 illustrates method 600 according to an embodiment of the invention.

Method 600 starts by stage 610 of receiving an input signal.

Stage 610 is followed by stage 612 of measuring at least the current power level of the input signal.

Stage 612 is followed by stages 614 and 624.

Stage 614 includes selecting at least one selected non-linear power amplifier to be used to amplify a second signal based on at least: (i) a current power level of an input signal; (ii) an association between different power ranges and different non-linear power amplifiers; (iii) an identity of at least one previously selected non-linear power amplifiers.

Stage 614 may include selecting the at least one selected non-linear power amplifier in response to a magnitude of the input signal at a first moment, a magnitude of the input signal at a second moment, and to phases of the input signal at the first and the second moments.

Stage 614 may include accessing the lookup table when selecting the at least one selected non-linear power amplifier.

Stage 614 may be followed by stage 616 of activating the at least one selected non-linear power amplifier.

Stage 624 includes processing the input signal to provide the second signal such as to at least partially compensate for a non linearity of each of the at least one selected non-linear power amplifier.

Stage 624 may include processing the input signal in response to the magnitude of the input signal at the first moment, the magnitude of the input signal at the second moment, and to phases of the input signal at the first and the second moments.

Stage 624 may include processing the input signal by applying at least one filtering parameter to provide the second signal; the at least one filtering parameter is retrieved from a lookup table using a first, a second, and a third lookup table indexes, the first index is responsive to a magnitude of the input signal at a first moment, the second index is responsive to a magnitude of the input signal at a second moment, and the third index is responsive to phases of the input signal at the first and the second moments; the method comprises delaying the input signal before the input signal is provided to the signal processing module.

Stage 624 may be followed by stage 626 of amplifying the second signal by the at least one selected non-linear power amplifiers. Stage 626 occurs after stage 616 is completed.

Method 600 may also include stage 632 of determining a desired gain attribute of each of the at least one selected non-linear power amplifier to be used to amplify the second signal. Stage 632 is followed by stage 634 of setting the gain attribute of each of the at least one selected non-linear power amplifiers to the desired gain attribute. Stage 634 may be completed before starting stage 626.

Multiple iterations of the previous stages can be applied in order to provide a make before break policy—and activating a first non-linear power amplifier associated with a first power range before deactivating a second non-linear power amplifier associated with a second power range that partially overlaps the first power range. It is noted that other policies can be applied—for example—simultaneous make and break.

According to an embodiment of the invention stage 612 is followed by stage 640 (instead of being directly followed by stage 624). Stage 640 includes delaying the input signal such that the input signal arrives to the signal processing module when the at least one filtering parameter reaches the signal processing module. Stage 640 is followed by stage 624.

The method may also include stage 650 of updating at least one filtering parameter of the lookup table by calculating a cross signals error, and utilizing an adaptive algorithm to calculate the at least one filtering parameter such as to eliminate the cross signals error. Stage 650 may include updating at least one filtering parameter of the lookup table by using a post distorter Voltera polynomial.

The method may include sampling the input signal more than once between the first and second moments to provide multiple samples and measuring one or more attributes of these samples—such as a current power level of the input signal. The method may include sampling the input signal to provide a number of samples between the first and second moment and the number changes between filtration of the input signal in different times.

Figure 7:
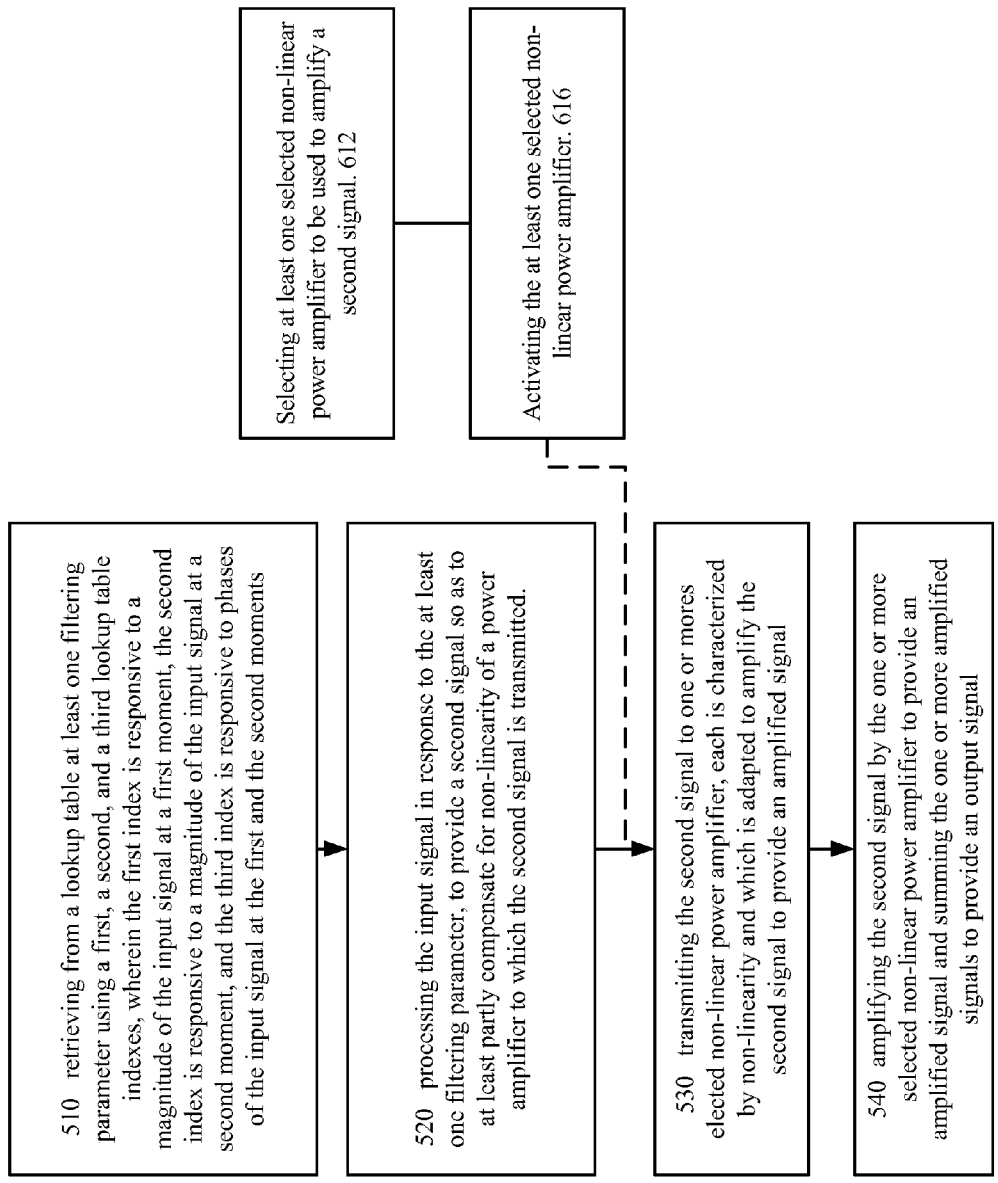
FIG. 7 illustrates a method, according to an embodiment of the invention.

FIG. 7 illustrates method 500 for processing an input signal using, according to an embodiment of the invention.

Method 500 conveniently starts with stages 510 and 612.

Stage 510 includes retrieving from a lookup table at least one filtering parameter using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments.

Stage 510 is followed by stage 520 of processing the input signal in response to the at least one filtering parameter, to provide a second signal so as to at least partly compensate for non-linearity of a non-linear power amplifier to which the second signal is transmitted.

Stage 520 is followed by stage 530 of transmitting the second signal to at least one selected non-linear power amplifier that is characterized by non-linearity, each selected non-linear power amplifier is adapted to amplify the second signal to provide an amplified signal.

According to an embodiment of the invention, method 500 may continue with stage 540 of amplifying the second signal by the at least one selected non-linear power amplifier to provide an amplified signal and combining the signals outputted by the entire one or more selected non-linear power amplifiers to provide an output signal.

Stage 612 includes selecting at least one selected non-linear power amplifier to be used to amplify a second signal. Stage 612 can be followed by stage 616 of activating the at least one selected non-linear power amplifier. Stage 616 should be completed before starting stage 530.

According to an embodiment of the invention, the at least one filtering parameter consists of a complex compensation coefficient, wherein the processing includes multiplying the input signal by the compensation coefficient.

According to an embodiment of the invention, the retrieving includes retrieving the at least one filtering parameter from a three dimensional lookup table.

According to an embodiment of the invention, method 500 further includes updating at least one filtering parameter of the lookup table in response to the amplified signal. For example, according to several embodiments of the invention, the updating may include updating one or more filtering parameters stored the lookup table by computing the filtering parameters using one of the following ways:

i. Using the signal and a feedback signal responsive to the output signal, for calculating a cross signals error, and utilizing an adaptive algorithm to calculate the filtering parameters of the lookup table for eliminating the cross signals error.

ii. Using a post distorter Voltera polynomial to adaptively calculate the filtering parameters.

It is noted that method 500 may conveniently be carried out by a system such as system 200. Referring to the examples set forth in the previous drawings, the retrieving may be carried out by memory unit 240, by signal processing module 220, or by a dedicated unit, the processing may be carried out by signal processing module 220, and the amplifying may be carried out by non-linear power amplifier. It is noted that different embodiments of system 200 may be implemented by corresponding embodiments of method 500, even if not explicitly elaborated, and vice versa.

Any combination of methods 200 and 300 or stages of methods 200 and 300 can be provided.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for amplifying an input signal, the system comprising:

a measurement circuit arranged to measure at least a current power level of the input signal;

multiple non-linear power amplifiers; wherein different non-linear power amplifiers are associated with different power ranges;

a control circuit arranged to:
(a) select at least one selected non-linear power amplifier to be used to amplify a second signal based on at least:
the current power level of an input signal;
an association between the different power ranges and the different non-linear power amplifiers;
an identity of at least one previously selected non-linear power amplifier that was selected during a previous selection process; and
(b) assist in an activation of the at least one selected non-linear power amplifier; and a signal processing module, configured to process the input signal to provide the second signal such as to at least partially compensate for a non-linearity of each of the at least one selected non-linear power amplifier.

2. The system according to claim 1, wherein the control circuit is arranged to select only a single non-linear power amplifier when a current power level of the input signal belongs to any non-overlapping portion of any power range of the different power ranges.

3. The system according to claim 1, wherein the control circuit is arranged to select multiple non-linear power amplifiers only when a current power level of the input signal belongs to any overlapping portions of any pairs of power ranges of the different power ranges.

4. The system according to claim 1, wherein adjacent power ranges partially overlap and wherein the control circuit is arranged to activate a first non-linear power amplifier associated with a first power range before deactivating a second non-linear power amplifier associated with a second power range that partially overlaps the first power range when the power level of the input signal changes from being within the second power range to being within the first power range.

5. The system according to claim 1, wherein the control circuit is arranged to select the at least one selected non-linear power amplifier in response to a magnitude of the input signal at a first moment, a magnitude of the input signal at a second moment, and to phases of the input signal at the first and the second moments.

6. The system according to claim 5, wherein the signal processing module is arranged to process the input signal in response to the magnitude of the input signal at the first moment, the magnitude of the input signal at the second moment, and to phases of the input signal at the first and the second moments.

7. A system for amplifying an input signal, the system comprising: a measurement circuit arranged to measure at least a current power level of the input signal; multiple non-linear power amplifiers; wherein different non-linear power amplifiers are associated with different power ranges; a control circuit arranged to:
select at least one selected non-linear power amplifier to be used to amplify a second signal based on at least: the current power level of an input signal; an association between the different power ranges and the different non-linear power amplifiers; an identity of at least one previously selected non-linear power amplifier; and (b) assist in an activation of the at least one selected non-linear power amplifier; and a signal processing module, configured to process the input signal to provide the second signal such as to at least partially compensate for a non-linearity of each of the at least one selected non-linear power amplifier; wherein the signal processing module is arranged to process the input signal by applying at least one filtering parameter to provide provide the second signal; wherein the at least one filtering parameter is retrieved from a lookup table using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments; wherein the system comprises a delay circuit for delaying the input signal before the input signal is provided to the signal processing module.

8. The system according to claim 7, wherein the control circuit is arranged to access the lookup table when selecting the at least one selected non-linear power amplifier.

9. The system according to claim 7, comprising a delay circuit that is arranged to delay the input signal such as to arrive to the signal processing module when the at least one filtering parameter reaches the signal processing module.

10. The system according to claim 7, further comprising a table updating module, configured to update at least one filtering parameter of the lookup table by calculating a cross signals error, and utilizing an adaptive algorithm to calculate the at least one filtering parameter such as to eliminate the cross signals error.

11. The system according to claim 7, further comprising a table updating module, configured to update at least one filtering parameter of the lookup table by using a post distorter Voltera polynomial.

12. The system according to claim 7, wherein the system is arranged to sample the input signal more than once between the first and second moments.

13. The system according to claim 7, wherein the system is arranged to sample the input signal to provide a number of samples between the first and second moment and wherein the number changes between filtration of the input signal in different times.

14. A method for amplifying an input signal, the method comprising:
receiving an input signal;
measuring at least the current power level of the input signal;
selecting at least one selected non-linear power amplifier to be used to amplify a second signal based on at least:
a current power level of an input signal;
an association between different power ranges and different non-linear power amplifiers;
an identity of at least one previously selected non-linear power amplifier that was selected during a previous selection process;
activating the at least one selected non-linear power amplifier;
processing the input signal to provide the second signal such as to at least partially compensate for a non-linearity of each of the at least one selected non-linear power amplifier; and
amplifying the second signal by the at least one selected non-linear power amplifiers.

15. The method according to claim 14, comprising:
selecting only a single non-linear power amplifier when a current power level of the input signal belongs to any non-overlapping portion of any power range of the different power ranges.

16. The method according to claim 14, comprising selecting multiple non-linear power amplifiers only when a current power level of the input signal belongs to any overlapping portions of any pairs of power ranges of the different power ranges.

17. The method according to claim 14, wherein adjacent power ranges partially overlap and wherein the method further comprises activating a first non-linear power amplifier associated with a first power range before deactivating a second non-linear power amplifier associated with a second power range that partially overlaps the first power range.

18. The method according to claim 14, comprising selecting the at least one selected non-linear power amplifier in response to a magnitude of the input signal at a first moment, a magnitude of the input signal at a second moment, and to phases of the input signal at the first and the second moments.

19. The method according to claim 18, comprising processing the input signal in response to the magnitude of the input signal at the first moment, the magnitude of the input signal at the second moment, and to phases of the input signal at the first and the second moments.

20. A method for amplifying an input signal, the method comprising: receiving an input signal; measuring at least the current power level of the input signal; selecting at least one selected non-linear power amplifier to be used to amplify a second signal based on at least: a current power level of an input signal; an association between different power ranges and different non-linear power amplifiers; an identity of at least one previously selected non-linear power amplifier; activating the at least one selected non-linear power amplifier; processing the input signal to provide the second signal such as to at least partially compensate for a non-linearity of each of the at least one selected non-linear power amplifier; amplifying the second signal by the at least one selected non-linear power amplifiers; and processing the input signal by applying at least one filtering parameter to provide the second signal; wherein the at least one filtering parameter is retrieved from a lookup table using a first, a second, and a third lookup table indexes, wherein the first index is responsive to a magnitude of the input signal at a first moment, the second index is responsive to a magnitude of the input signal at a second moment, and the third index is responsive to phases of the input signal at the first and the second moments; wherein the method comprises delaying the input signal before the input signal is provided to the signal processing module.

21. The method according to claim 20, comprising accessing the lookup table when selecting the at least one selected non-linear power amplifier.

22. The method according to claim 20, comprising delaying the input signal such that the input signal arrives to the signal processing module when the at least one filtering parameter reaches the signal processing module.

23. The method according to claim 20, further comprising updating at least one filtering parameter of the lookup table by calculating a cross signals error, and utilizing an adaptive algorithm to calculate the at least one filtering parameter such as to eliminate the cross signals error.

24. The method according to claim 20, further comprising updating at least one filtering parameter of the lookup table by using a post distorter Voltera polynomial.

25. The method according to claim 20, comprising sampling the input signal more than once between the first and second moments.

26. The method according to claim 20, comprising sampling the input signal to provide a number of samples between the first and second moment and wherein the number changes between filtration of the input signal in different times.

* * * * *